United States Patent [19]

Remo

[11] Patent Number: 5,018,861
[45] Date of Patent: May 28, 1991

[54] METHODS AND MEANS FOR FULL-SURFACE INTERFEROMETRIC TESTING OF GRAZING INCIDENCE MIRRORS

[75] Inventor: John L. Remo, St. James, N.Y.

[73] Assignee: Quantametrics Inc., St. James, N.Y.

[21] Appl. No.: 370,306

[22] Filed: Jun. 22, 1989

[51] Int. Cl.$^5$ .............................................. G01B 9/02
[52] U.S. Cl. .................................. 356/353; 356/351; 356/356; 356/360
[58] Field of Search ............... 356/351, 353, 355, 356, 356/358, 359, 360

[56] References Cited

U.S. PATENT DOCUMENTS 3,849,003 11/1974 Velzel .................................. 356/353
4,844,616 7/1989 Kulkarni et al. ..................... 356/358

Primary Examiner—Samuel Turner
Attorney, Agent, or Firm—Stanger, Michaelson, Spivak & Wallace

[57] ABSTRACT

The disclosed method and means measure the characteristics of an optical device by directing light waves by normal-incidence sub-aperture interferometry on the optical device, shear-polarizing the light directed onto the optical device, and analyzing the results of the interference to obtain the characteristics of the optical device.

2 Claims, 3 Drawing Sheets

METHODS AND MEANS FOR FULL-SURFACE INTERFEROMETRIC TESTING OF GRAZING INCIDENCE MIRRORS

BACKGROUND OF THE INVENTION

This invention relates to methods and means for analyzing the figure and surface roughness characteristics of grazing incidence optics, for example the type that would be utilized in the generation and propagation of directed energy in the X-ray and hard UV regions, and the type used in chemical lasers, excimer lasers, laboratory x-ray lasers, gamma ray lasers, and free electron lasers.

Optical components used in X-ray and hard UV radiation at grazing incidence are generally in the shape long narrow segments of cylinders. Other grazing incidence and beam coupling optics include a wide variety of aspheric surfaces such as off-axis paraboloids, toroids, ellipsoids, etc. Such aspheres are generally difficult to test by conventional interferometry since the diffraction limitation at visible wavelengths makes the interpretation of interferograms extremely difficult. Testing finished optics requires a noncontact arrangement to avoid potential accidents which could damage the surface.

In the past, such tests and measurements have been slow and created sensitivity to thermal and other environmental effects that have seriously impaired the effectiveness of instruments that attempted to measure the figure of optical surfaces to the tolerances necessary for grazing incidence X-ray, UV and imaging at other wavelengths by off-axis aspheric optics. Classical interferometers of the Twyman-Green or Fizeau types have shown sensitivity to vibration and turbulence, required complex null optics, and operated at slow speeds with limited accuracy.

OBJECTS AND SUMMARY OF THE INVENTION

An object of the invention is to overcome these difficulties.

An object of the invention is to improve methods and means for conveniently and accurately measuring both the full surface figure as well as the surface roughness of optical devices.

Another object is to carry out these measurements rapidly.

According to a feature of the invention, these objects are attained in whole or in part by causing interference between two laterally sheared waves produced by a Wollaston prism.

According to another feature, an interferometer creating the interference operates in the common path, equal path mode.

According to still another feature, the measurements are made of individual sub-apertures phases by normal incidence interferometry. These sub-apertures overlap and are combined into the full surface shape.

These and other features of the invention are pointed out in the claims. Other objects and advantages of the invention will become evident from the following detailed description when read in light of the accompanying drawings.

DETAILED DESCRIPTION OF PREFERRED EMBODIMENTS

Figure 1:
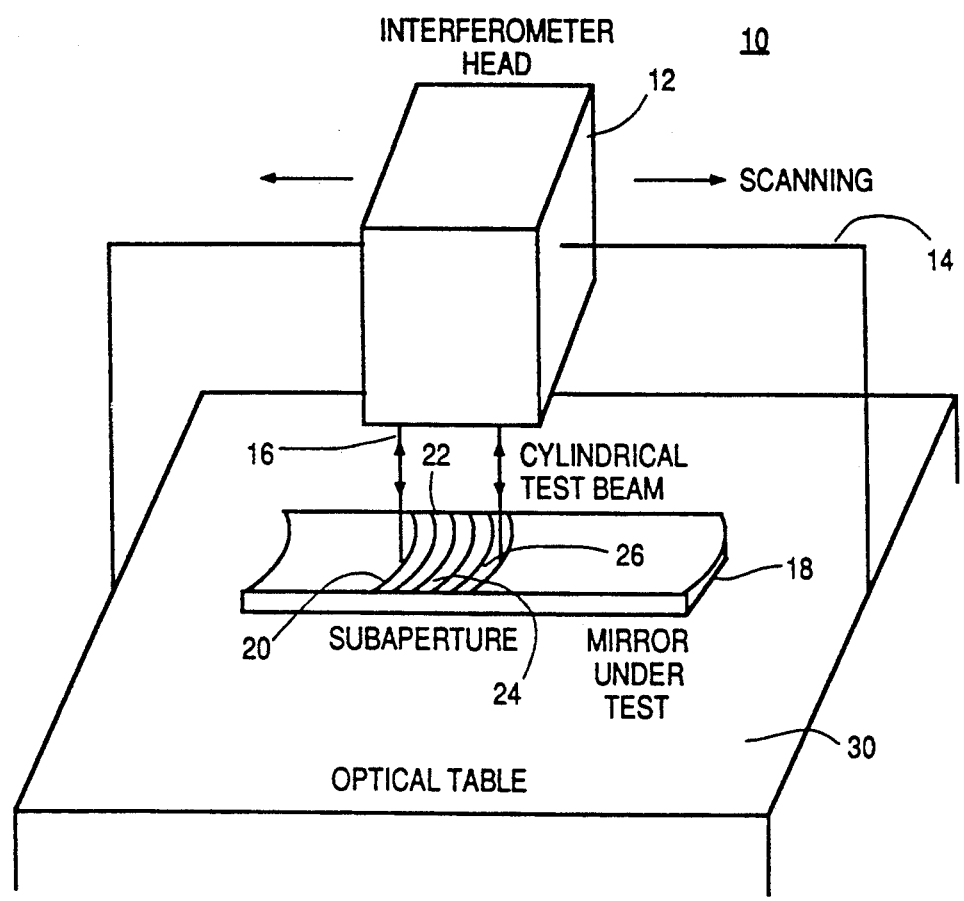
FIG. 1 is a partially schematic perspective view of a device embodying features of the invention.
Figure 4:
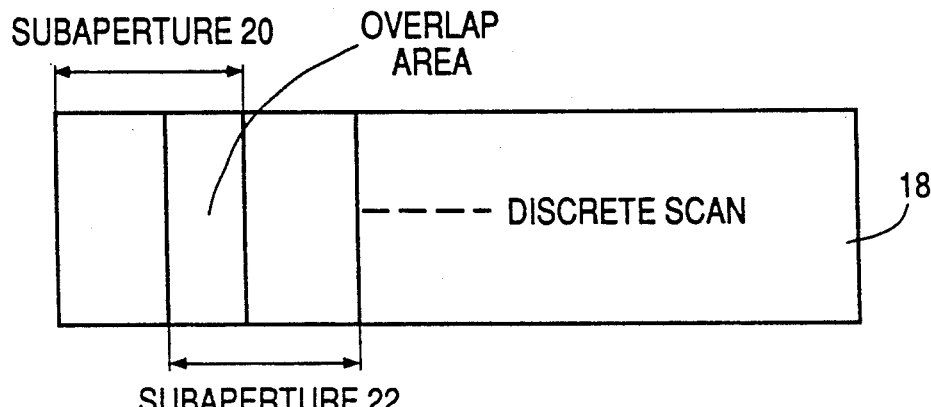
FIG. 4 is a plan view of the scanning arrangement performed by the device of FIG. 1.

In FIG. 1, a polarization shearing interferometer 10 embodying the invention includes an interferometer head 12 in the form of a polarization shearing interferometer. A scanning arrangement 14 shown only as a line cooperates with the head 12 to translate the head laterally in discrete steps. The head 12 projects a cylindrical test beam 16 onto the test optic, namely a mirror 18 under test. The test beam 16 produces sub-aperture projections, for example sub-aperture projections 20–26, which overlap as shown in FIG. 4. An optical table 30 holds the test mirror and the spectrometer 10.

Figure 2:
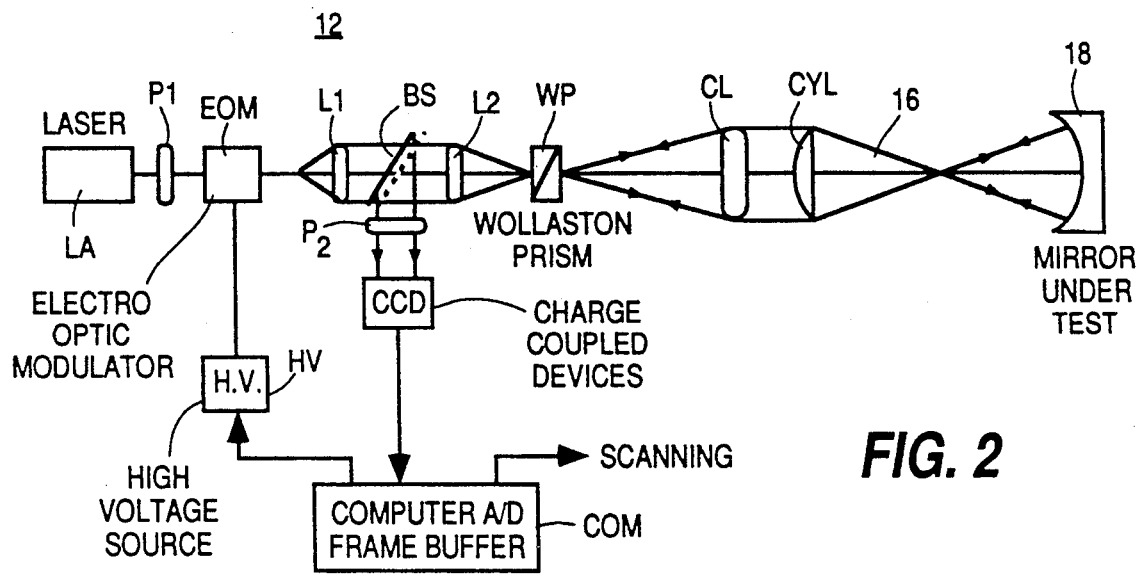
FIG. 2 is a block diagram of a portion of the device in FIG. 1.

FIG. 2 illustrates details of the head 12 as it projects the test beam 16 onto the mirror 18. Here, a polarizer P1 passes a beam from a laser LA through a phase-shifting electro-optic modulator EOM. A beam-expanding lens L1 forms a parallel expanded beam which a beam splitter BS transmits to a second lens L2. The latter focuses the light through a Wollaston prism WP at the focus of the lens L2. A collimating lens CL receives the light from prism WP and produces a parallel beam. A cylindrical lens CYL projects the light onto the mirror 18 in an expanded cylindrical beam 16.

Figure 3:
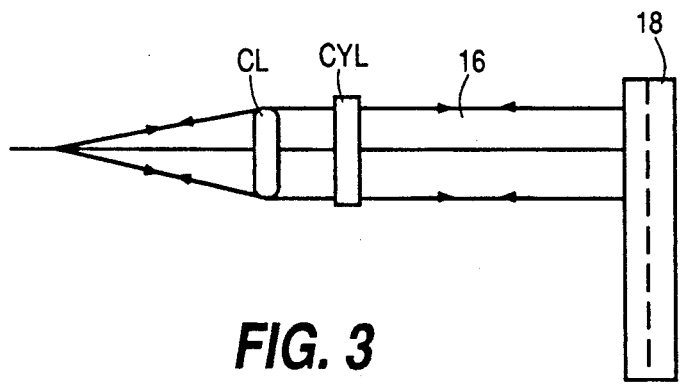
FIG. 3 is a plan view of a portion of FIG. 2.

FIG. 3 shows a top view of the lens CL, the lens CYL and the mirror 18.

The mirror 18 returns the light through lenses CYL and CL, the prism WP, and the lens L2. The beam splitter BS reflects the returned light toward a polarizer P2 which transmits the light so it strikes one or more charge coupled devices CCD which sense the light. The latter transduces the light into electrical signals. A computer COM analyzes the data from the devices CCD. The computer COM also utilizes the signals from the devices CCD to control scanning by the head 12, and drives a high voltage source HV that adjusts the modulator EOM.

The interferometer measures the slopes z/ x and z/ y from which the computer COM determines the shape function z(x,y). The head 12 scans the mirror 18 by making overlapping sub-aperture projections.

FIG. 4 is a schematic diagram illustrating sub-aperture projections 20 and 21 of the head 12 as it scans the mirror 18 during a sub-aperture test. Successive sub-apertures are measured by phase measuring interferometry and the full surface shape is synthesized by a least-square method using continuity cryterions and information from the overlap areas. The result is a long trace and full aperture surface scan.

Processing by the computer COM involves digital phase measurement which yields the "x" and "y" slopes, and digital two dimensional integration which yields the surface profile for each sub-aperture. The computer COM synthesizes the full surface profile with uniform accuracy throughout from the set of sub-aperture interferograms using surface fitting.

In general, the interferometer 10 includes a translatable optical head 12, an expanded cylindrical beam 16, and sub-aperture projections such as 20 to 26 on the test optic 18. The entire assembly rests on an optical table 30. The head 12 is that of a modified polarization shearing interferometer. Its advantages are that the scans are fast, operate with a high degree of stability, are capable of separate "x" and "y" measurement, can be aligned on a test surface, have a variable sensitivity, and be sensitive to slope errors.

Figure 5:
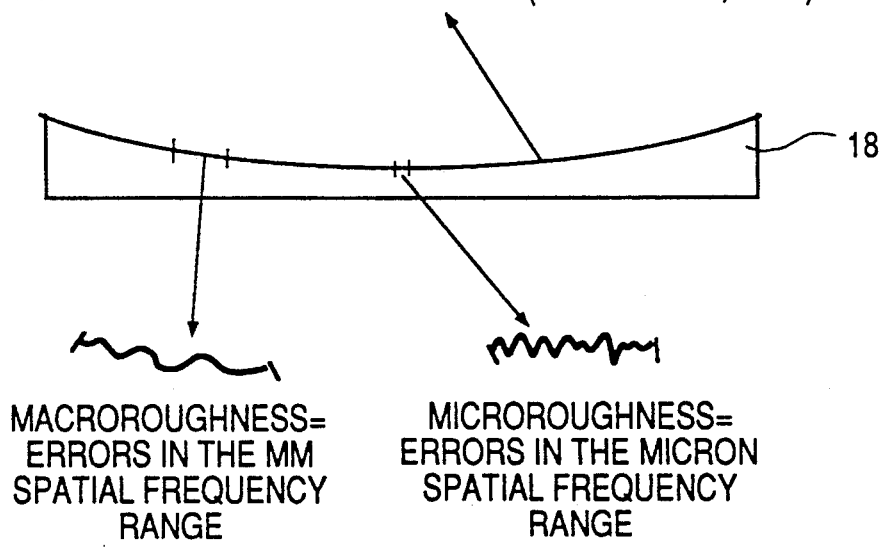
FIG. 5 is a sectional view of a mirror illustrating the types of errors which may be tested.

FIG. 5 illustrates the meanings of the terms "Figure" as the overall surface shape (curvature, etc.) of the mirror 18, "Macroroughness" as errors in the mm spatial frequency range, and "Microroughness" as errors in the micron spatial frequency range. The interferometer 10 according to the invention scans and measures sub-apertures and synthesizes them into a full aperture scan that yields the macroroughness and optical figure of the full surface. The microroughness is measured, for instance, by the Wyko profiler. The interferometer 10 carries out the measurements rapidly, such as in less than 1 second, thereby minimizing sensitivity to thermal and other environmental effects that have seriously impaired the effectiveness of instruments that attempted to measure the figure of optical surfaces to the tolerances necessary for grazing incidence X-ray, UV and imaging at other wavelengths by off-axis aspheric optics.

The invention overcomes the many difficulties encountered by known interferometer of the Twyman-Green or Fizeau types by reducing sensitivity to vibration and turbulence. The interferometer can measure aspherical surfaces with high speed and accuracy. The polarization nature of the invention permits desensitized and controlled fringe manipulation external to the interferometer. The invention uses normal incidence, sub-aperture interferometry and polarization shearing interferometry. It surmounts many of the problems encountered by other techniques. It involves three sequential operations, namely, sub-aperture slope measurement, wavefront integration, and surface profile synthesis. The instrument 10 is suitable for X-ray and UV high resolution lithography, medical imaging, basic research in astronomy, physics, and microbiology.

While embodiments of the invention have been described in detail, it will be obvious to those skilled in the art that the invention may be embodied otherwise.

What is claimed is:

1. An apparatus for measuring the characteristics of an optical device, comprising:

normal incidence, sub-aperture interferometry means for obtaining sequential data from sequential overlapping sub-aperture areas of the optical device;

said interferometry means including polarization shearing means for shear polarizing light in said sub-aperture interferometry means;

synthesizing means coupled to said interferometry means for analyzing the characteristics obtained from said interferometry means; and said synthesizing means including means for combining the sequential data from the sequential overlapping sub-aperture areas of the optical device.

2. A method of measuring the characteristics of an optical device, comprising:

sequentially directing light waves onto sequential overlapping sub-aperture areas of the optical device at normal incidence so that the sequential sub-aperture areas of the optical device reflect the light and interfere with the light so as to produce interference measurements;

shear-polarizing the light directed onto the optical device; and analyzing results of the interference obtained from the light to obtain the characteristics of the optical device, by combining sequential data from sequential overlapping sub-aperture areas of the optical device.

* * * * *